United States Patent [19]
Tokuno et al.

[11] Patent Number: 5,767,689
[45] Date of Patent: Jun. 16, 1998

[54] BARE CHIP TEST CARRIER WITH AN IMPROVED HOLDING STRUCTURE FOR A SEMICONDUCTOR CHIP

[75] Inventors: Kenichi Tokuno; Akihiro Dohya, both of Tokyo, Japan

[73] Assignee: NEC Corporation, Tokyo, Japan

[21] Appl. No.: 575,480

[22] Filed: Dec. 20, 1995

[30] Foreign Application Priority Data

Dec. 20, 1994 [JP] Japan ..................... 6-317157

[51] Int. Cl.$^6$ ........................... G01R 31/02
[52] U.S. Cl. ........................... 324/754; 324/758
[58] Field of Search ........................... 324/754, 755, 324/758, 757

[56] References Cited

U.S. PATENT DOCUMENTS

| | | | |
|---|---|---|---|
| 4,597,617 | 7/1986 | Enochs | 439/66 |
| 5,109,320 | 4/1992 | Bourdelaise et al. | 361/785 |
| 5,302,891 | 4/1994 | Wood et al. | 324/765 |
| 5,367,253 | 11/1994 | Wood et al. | 324/158.1 |
| 5,402,077 | 3/1995 | Agahdel et al. | 324/758 |
| 5,408,190 | 4/1995 | Wood et al. | 324/765 |
| 5,483,174 | 1/1996 | Hembree et al. | 324/765 |
| 5,541,525 | 7/1996 | Wood et al. | 324/755 |
| 5,572,140 | 11/1996 | Lim et al. | 324/755 |
| 5,578,934 | 11/1996 | Wood et al. | 324/758 |

*Primary Examiner*—Ernest F. Karlsen
*Assistant Examiner*—Russell M. Kobert
*Attorney, Agent, or Firm*—Young & Thompson

[57] ABSTRACT

A chip tester for holding a semiconductor chip bonded via convex electrodes to a flexible substrate. The tester has a carrier body with a flat surface in contact with the flexible board. The carrier body overlies the flexible substrate so as to press down the flexible substrate. The tester also has a chip plate that underlies and contacts the semiconductor chip so as to urge the semiconductor chip toward the flexible substrate. At least a flat contact surface of the chip plate is made of an elastic material with a high elastic coefficient to obtain an adhesion with the semiconductor chip to prevent lateral displacement of the semiconductor chip. The tester also has a chip plate holder that underlies the flexible substrate and is positioned around both the semiconductor chip and the chip plate. The chip plate holder is spaced apart from the semiconductor chip so that the chip plate holder sandwiches the flexible substrate in cooperation with the carrier body.

5 Claims, 4 Drawing Sheets

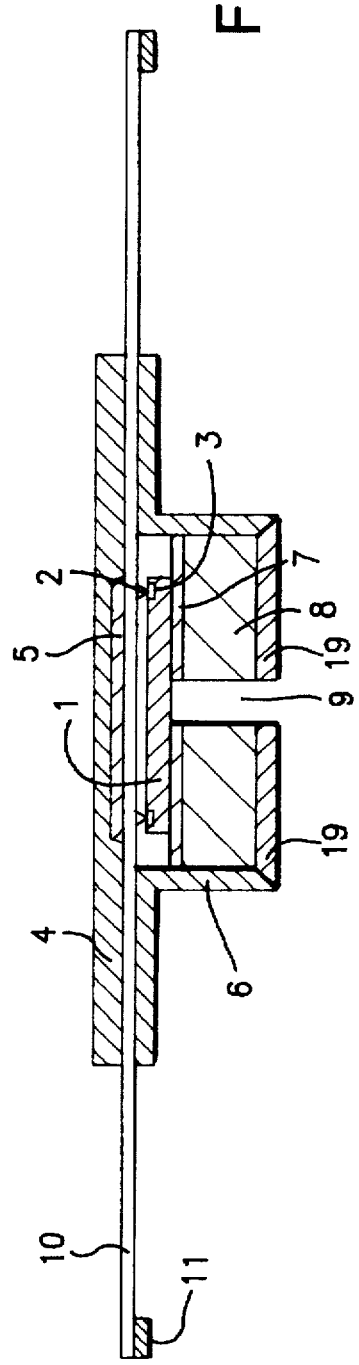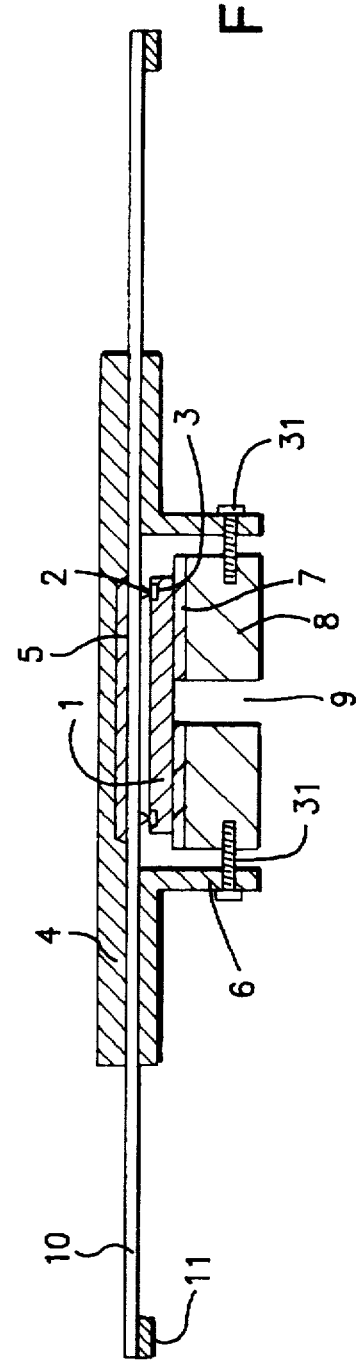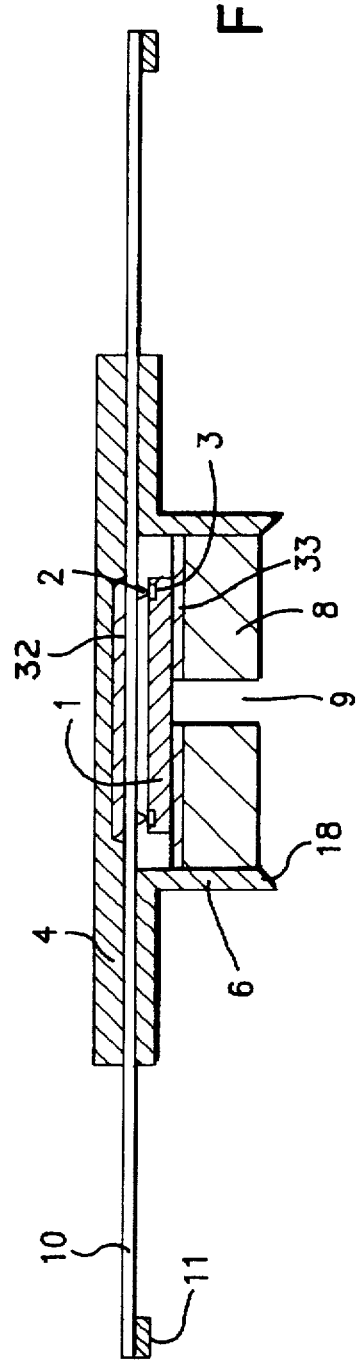

BARE CHIP TEST CARRIER WITH AN IMPROVED HOLDING STRUCTURE FOR A SEMICONDUCTOR CHIP

BACKGROUND OF THE INVENTION

The present invention relates to a bare chip test carrier with an improved holding structure for a semiconductor chip.

Many types of the bare chip test carriers have been developed to conduct the test for electrical performances of this semiconductor integrated circuits on a chip, such as the BT aging test, and others. One of the conventional bare chip test carriers is illustrated in FIG. 1. The bare chip test carrier has a structure for holding a semiconductor chip 1 which is bonded via electrode pads 3 to carrier bump electrodes 2 provided on a flexible substrate 10. Outside edges of the flexible substrate 10 are supported by outer frames 11. The bare chip test carrier structure has a carrier body 4 which has a plate-like shape with a flat surface which is in contact with the flexible substrate 10. The flexible substrate 10 is kept plane with no curvature as illustrated in FIG. 1. The carrier body 4 is made of a metal such as aluminum alloy. The carrier body 4 is provided to overlie the flexible substrate 10 so as to press down the flexible substrate 10. The bare chip test carrier structure has a chip holder 16 for holding the semiconductor chip 1. The chip holder 16 comprises lateral and vertical portions. The lateral portion of the chip holder 16 is in contact with the flexible substrate 10 to sandwich the flexible substrate 10 in cooperation with the carrier body 4. The vertical portion of the chip holder 16 has a top which is united with an inside edge of the lateral portion. The vertical portion of the chip holder 16 has an inner surface in contact securely with an outside edge of the semiconductor chip 1 to allow an accurate positioning of the semiconductor chip 1. For this purpose, the chip holder 16 should be designed to fit the semiconductor chip 1 perfectly. An accurate size of the chip holder 16 for perfectly fitting the semiconductor chip 1 is necessary. A chip supporting plate 15 is further provided to underlie the semiconductor chip 1. The chip supporting plate 15 is pivotally fixed at its end to the bottom of the vertical portion of the chip holder 16. The chip supporting plate 15 is made of a plastic material. The chip supporting plate 15 supports and presses up the semiconductor chip 1 from the bottom so as to assist the bonding of the semiconductor chip 1 to the flexible substrate 10.

As described above, the positioning of the semiconductor chip 1 in relation to the flexible substrate 10 is set by the chip holder 16. In order to obtain the accurate positioning of the semiconductor chip 1, it is essential that the chip holder 16 be designed to fit the semiconductor chip 1 perfectly. However, it is in fact unavoidable that some of the semiconductor chips 1 have variations in the horizontal size. If there is any gap between the vertical portion of the chip holder 16 and the semiconductor chip 1, this means that the semiconductor chip 1 can be displaced by the size of the gap. In this case, it is no longer possible to accurately position the semiconductor chip 1 in relation to the flexible substrate 10. On the other hand, if the semiconductor chip 1 has a size slightly larger than the inner size of the vertical portion of the chip holder 16, then the semiconductor chip 1 can be caught by the inner walls of the vertical portions of the chip holder 16 without contacting the bump electrodes 2 of the flexible substrate 10. Otherwise, the semiconductor chip 1 can be caught by the inner walls of the vertical portions of the chip holder 16, wherein the semiconductor chip 1 is oblique. In these circumstances, if the semiconductor chip 1 is pressed up by the chip supporting plate 15, then the semiconductor chip 1 may be cracked or broken.

Accordingly, it is difficult to conduct the mechanical positioning of the semiconductor chip 1 without cracking or displacing the semiconductor chip 1.

Another conventional bare chip test carrier is illustrated in FIG. 2. The other bare chip test carrier has a structure for holding a semiconductor chip 1 which is bonded to beam leads 17 extending from a center hole of a flexible substrate 20. Outside edges of the flexible substrate 20 are supported by outer frames 11. The bare chip test carrier structure has a carrier body 24 which has convex portions 21 extending downward from the inside edges of the carrier body 24. The convex portions 21 cause the beam leads 17 to be bent downward so that the tops of the beam leads 17 contact the electrode pads 3 on the semiconductor chip 1. The semiconductor chip 1 is supported by a chip supporting plate 28 which underlies the semiconductor chip 1. The chip supporting plate 28 is held by chip plate holders 26. Each of the chip plate holders 26 comprises a horizontal portion and a portion extending downwardly from the inside edge of the horizontal portion. The bottom of the downwardly extending portion has a claw 22 which presses up the bottom surface of the chip supporting plate 28 for supporting the chip supporting plate 28. The plate 28 is pressed by the claws 22 until the plate 28 contacts stoppers 23 which extend downwardly from the carrier body 24. Thus, the chip supporting plate 28 is held by the stoppers 23 in cooperation with the claws 22. The semiconductor chip 1 is secured with the plate 28 by the elastic force of the beam leads 17. In other words, semiconductor chip 1 is pressed to the plate 28 by the elastic force of the beam leads 17. However, the elastic force is insufficient for securing the semiconductor chip 1 in relation to the chip plate 28. As a result, the semiconductor chip 1 may be displaced by a vibration or an accretion in the lateral direction. It is therefore difficult to accurately position the semiconductor chip.

SUMMARY OF THE INVENTION

Accordingly, it is an object of the present invention to provide a novel bare chip test carrier structure free from the above problems.

The above and other objects, advantages of the present invention will be apparent from the following description.

The present invention provides a bare chip test carrier structure for holding a semiconductor chip bonded via convex electrodes to a flexible substrate. The bare chip test carrier structure has a carrier body. The carrier body has a flat surface in contact with the flexible board which is kept plane with almost no curvature. The carrier body is provided to overlie the flexible substrate so as to press down the flexible substrate. The bare chip test carrier structure also has a chip plate having a plate-like shape. The chip plate underlies and contacts the semiconductor chip so as to press up the semiconductor chip bonded to the flexible substrate. At least a flat contact surface of the chip plate is made of an elastic material with a high elastic coefficient to obtain an adhesion with the semiconductor chip in a parallel direction to the contact surface to prevent any lateral displacement of the semiconductor chip. The bare chip test carrier structure also has a chip plate holder that underlies the flexible substrate and is positioned around both the semiconductor chip and the chip plate. The chip plate holder is spaced apart from the semiconductor chip so that the chip plate holder sandwiches the flexible substrate in cooperation with the carrier body. The chip plate holder presses up the chip plate to allow the chip plate to press up the semiconductor chip to thereby allow an accurate positioning of the semiconductor chip in a lateral direction by the adhesion with the elastic material with no contact between the chip plate holder and side portions of the semiconductor chip.

The present invention also provides another bare chip test carrier structure for holding a semiconductor chip bonded via convex electrodes to a flexible substrate. The other bare chip test carrier structure has a carrier body. The carrier body has a flat surface which is in contact with the flexible substrate which is kept plane with almost no curvature. The carrier body overlies the flexible substrate so as to press down the flexible substrate. The flat surface of the carrier body has a first elastic materials which extend at least over the convex electrodes to thereby allow the flexible substrate to be partially pushed by the convex electrodes into the first elastic materials for compensation of any difference in height between the convex electrodes for positioning the semiconductor chip in a lateral flat plane without any slope. The other bare chip test carrier structure has a chip plate having a plate-like shape. The chip plate underlies and contacts the semiconductor chip so as to press up the semiconductor chip bonded to the flexible substrate. At least a flat contact surface of the chip plate is made of a second elastic material with a high elastic coefficient to adhere to the semiconductor chip in a parallel direction to the contact surface to prevent any lateral displacement of the semiconductor chip. The other bare chip test carrier structure has a chip plate holder that underlies the flexible substrate and is positioned around both the semiconductor chip and the chip plate. The chip plate holder is spaced apart from the semiconductor chip so that the chip plate holder sandwiches the flexible substrate in cooperation with the carrier body. The chip plate holder presses up the chip plate to allow the chip plate to press up the semiconductor chip to thereby accurately position the semiconductor chip in a lateral direction by the adhesion with the elastic material with no contact between the chip plate holder and side portions of the semiconductor chip.

BRIEF DESCRIPTION OF THE DRAWINGS

Preferred embodiments according to the present invention will be described in detail with reference to the accompanying drawings.

FIG. 9 is a cross sectional elevation view illustrative of a novel bare chip test carrier structure in a sixth embodiment according to the present invention.

FIG. 10 is a cross sectional elevation view illustrative of a novel bare chip test carrier structure in a seventh embodiment according to the present invention.

FIG. 11 is a cross sectional elevation view illustrative of a novel bare chip test carrier structure in an eighth embodiment according to the present invention.

DESCRIPTION OF THE PREFERRED EMBODIMENTS

Figure 1:
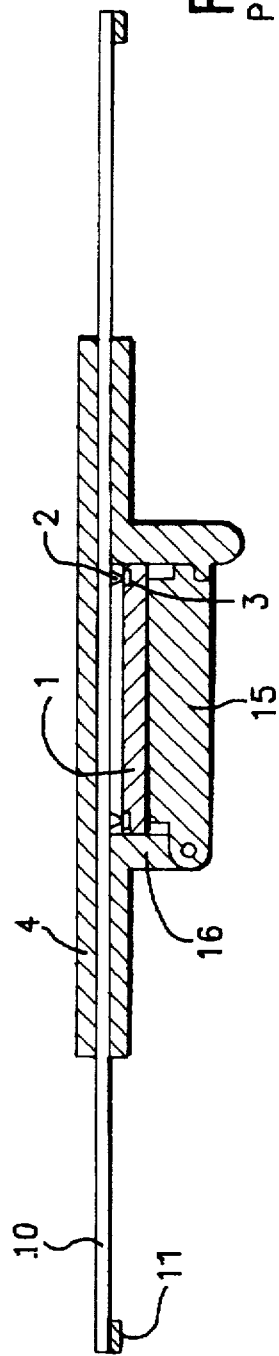
FIG. 1 is a cross sectional elevation view illustrative of the conventional bare chip test carrier structure.
Figure 3:
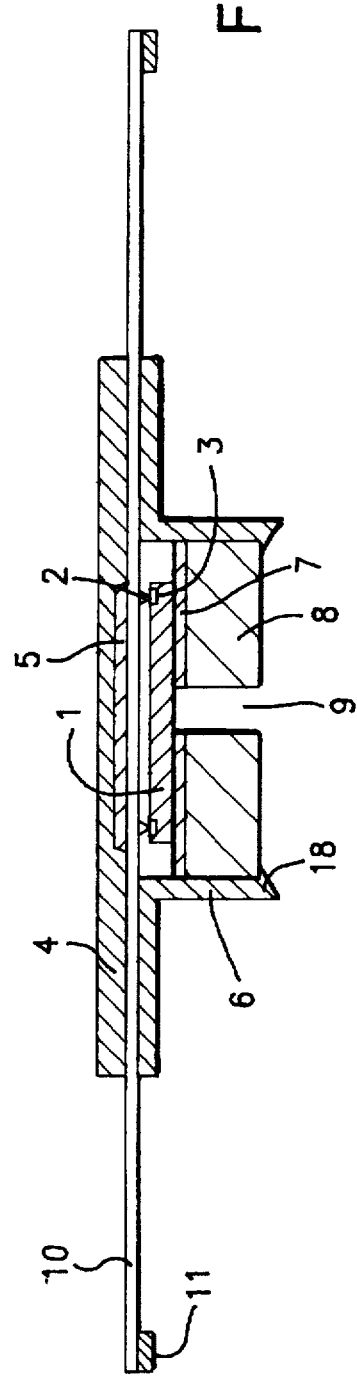
FIG. 3 is a cross sectional elevation view illustrative of a novel bare chip test carrier structure in a first embodiment according to the present invention.
Figure 4:
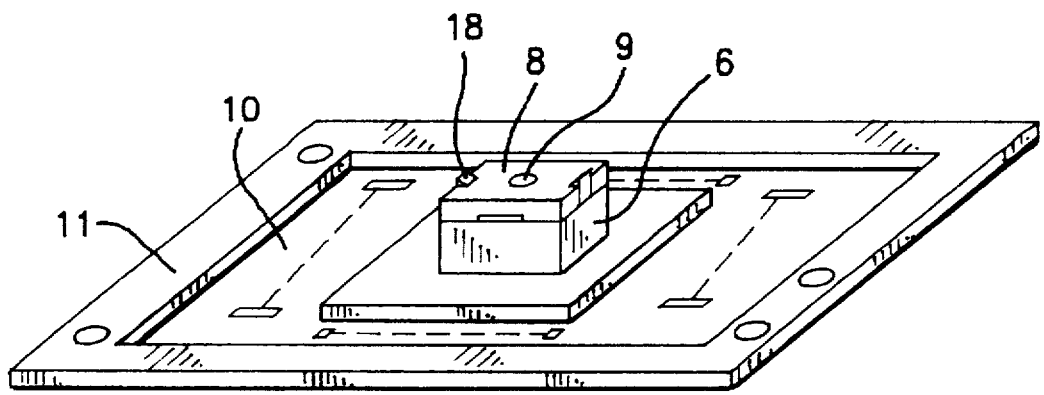
FIG. 4 is a schematic view illustrative of a novel bare chip test carrier structure according to the present invention.

A first embodiment according to the present invention will be described in detail with reference to FIGS. 3 and 4. There is provided a bare chip test carrier structure for holding a semiconductor chip 1 bonded via electrode pads 3 to carrier bump electrodes 2 that are in contact with a flexible substrate 10. Outside edges of the flexible substrate 10 are supported by outer frames 11. The bare chip test carrier structure has a carrier body 4 which has a plate-like shape having a flat surface in contact with the flexible substrate 10, wherein the flexible substrate 10 is kept flat with no curvature as illustrated in FIG. 3. The carrier body 4 is made of aluminum alloy. The carrier body has a recessed portion which receives a silicone layer 5 which extends over the semiconductor chip 1 so that the silicone layer 5 extends over at least the carrier bump electrodes 2. The carrier body 4 overlies the flexible substrate 10 so as to press down the flexible substrate. The silicone layer 5 is an elastic material and allows the flexible substrate 10 to be partially pushed by the carrier bump electrodes 2 into the silicone layer 5 for compensating for any difference in height between the convex electrodes to ensure the required positioning of the semiconductor chip in a lateral flat plane without any slope. Even if there is a difference in the heights of the carrier bump electrodes 2, the silicone layer 5 allows the flexible substrate 10 over the carrier bump electrode 2 with the larger height to curve into the silicone layer 5 while the flexible substrate 10 over the carrier bump electrode 2 with the smaller height extends into the silicone layer 5 with a smaller curvature so that the semiconductor chip 1 is kept level.

The bare chip test carrier structure has a chip plate 8 having a plate-like shape. The chip plate 8 is made of plastic material. The chip plate 8 has a lateral size larger than the semiconductor chip 1. A silicone layer 7 is provided on the chip plate 8. The silicone layer 7 has the same lateral size as the chip plate 8. The chip plate 8 underlies the semiconductor chip 1 so that the silicone layer 7 is in contact securely with the semiconductor chip 1 so as to press up the semiconductor chip 1 bonded to the flexible substrate 10. The silicone layer 7 ensures an adhesion force with the semiconductor chip 1 in a parallel direction to prevent any lateral displacement of the semiconductor chip 1 from the chip plate 8, even if a lateral vibration or accretion is applied to the semiconductor chip 1.

The bare chip test carrier structure has a chip plate holder 6. The chip plate holder 6 comprises lateral and vertical portions. The lateral portion of the chip plate holder 6 is in contact with the flexible substrate 10 to sandwich the flexible substrate 10 in cooperation with the carrier body 4.

The vertical portion of the chip plate holder 6 has a top which is united with an inside edge of the lateral portion. The vertical portion of the chip plate holder 6 has an inner surface being in contact securely with an outside surface of the chip plate 8. The vertical portion of the chip plate holder 6 has a bottom which has flexible claws 18. The claws 18 extend inwardly on the bottom surface of the chip plate for supporting the chip plate. The vertical portion of the chip plate holder 6 is, however, spaced apart from the semiconductor chip 1. The claws 18 of the chip plate holder 6 press up the chip plate 8 so that the chip plate 8 presses up the semiconductor chip 1 to thereby accurately position the semiconductor chip 1 in a lateral direction by the adhesion with the silicone layer 7 without any contact between the chip plate holder 6 and side portions of the semiconductor chip 1. A gap in the lateral direction between the chip plate holder 6 and the semiconductor chip 1 renders the semiconductor chip 1 free from being stuck by the vertical portion of the chip plate holder 6 when the semiconductor chip 1 is brought into contact with substrate 10 via the carrier bump electrodes 2. The above structure prevents the semiconductor chip 1 from receiving a stress or a force to bend the semiconductor chip 1 when being pressed up by the chip plate 8. The stress may cause the semiconductor chip 1 to be cracked.

The chip plate has a through hole 9 at its center for receiving air to detach the semiconductor chip 1 from the silicone layer 7 of the chip plate 8.

The bare chip test carrier 4 is mounted in a socket not illustrated to conduct both electrical performance tests and a BT aging test. When the bare chip test carrier is mounted in the socket, the external electrodes provided on the flexible substrate 10 are brought into contact with probes of the socket, wherein the external electrodes are electrically conductive to the carrier bump electrodes 2. As a result, the above tests are made possible. After the above tests, the bare chip carrier is removed from the socket. The chip plate holder 6 is removed by blowing air into the hole 9 so that the air blow presses up the semiconductor chip 1. As a result, the semiconductor chip 1 is detached from the silicone layer 7 on the chip plate 8.

The positioning of the semiconductor chip 1 on the silicone layer 7 on the chip plate 8 is carried out by an optical alignment technique, without reference to an external definition of the semiconductor chip 1 so that an exact alignment between the carrier bump electrodes 2 on the flexible substrate 10 and the electrode pads 3 on the semiconductor chip 1 is made possible. If a semiconductor wafer is to be cut to make any semiconductor chips which are aligned with the exact size between them, then it is necessary to conduct the optical alignment only on any one of the semiconductor chips.

Figure 5:
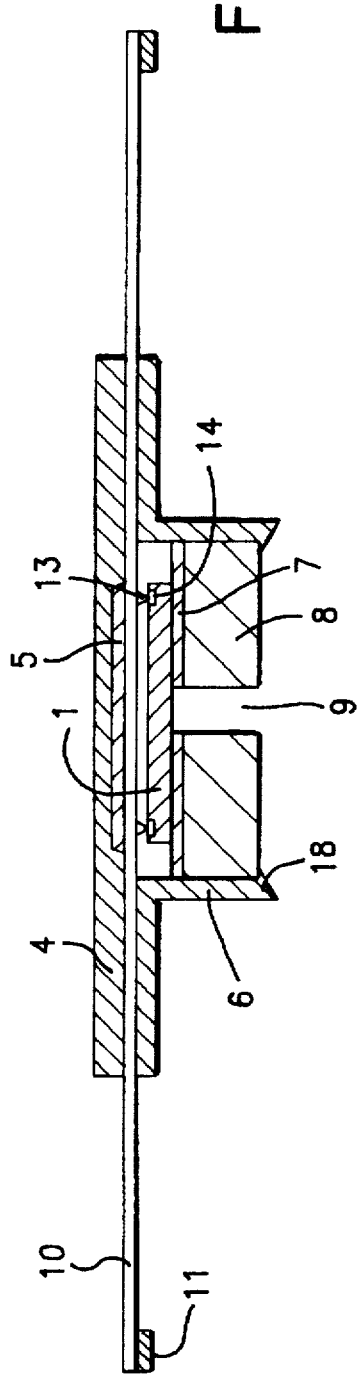
FIG. 5 is a cross sectional elevation view illustrative of a novel bare chip test carrier structure in a second embodiment according to the present invention.
Figure 2:
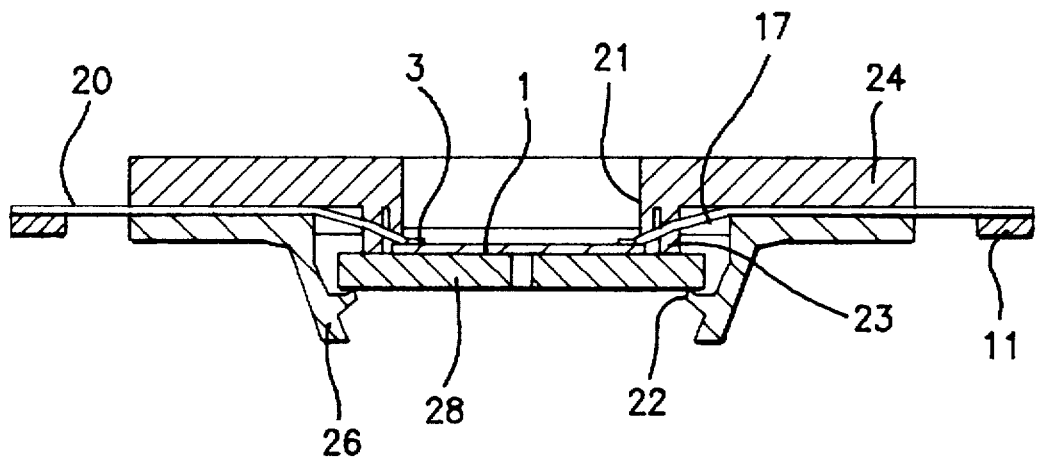
FIG. 2 is a cross sectional elevation view illustrative of the other conventional bare chip test carrier structure.

In a second embodiment according to the present invention illustrated in FIG. 5, the bare chip test carrier structure holds the semiconductor chip 1 bonded via bump electrodes 14 to carrier electrodes 13 that are in contact with a flexible substrate 10.

Figure 6:
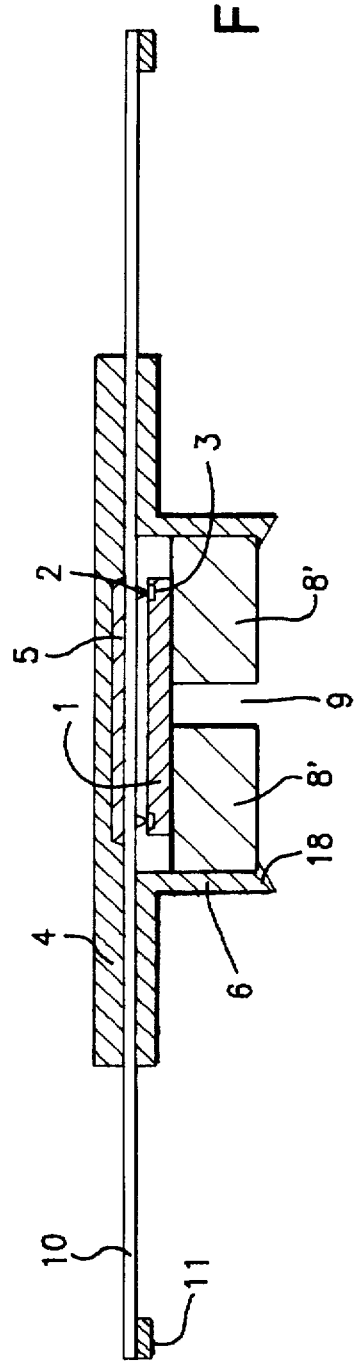
FIG. 6 is a cross sectional elevation view illustrative of a novel bare chip test carrier structure in a third embodiment according to the present invention.

A third embodiment according to the present invention will be described in detail with reference to FIG. 6. In this embodiment the bare chip test carrier structure has a chip plate 8' made of an elastic material of either silicone or a heat resistive rubber. The chip plate 8' has a lateral size larger than the semiconductor chip 1. The chip plate 8' underlies the semiconductor chip 1 to be in contact securely with the semiconductor chip 1 so as to press up the semiconductor chip 1 bonded to the flexible substrate 10. The chip plate 8' is made of the silicone or the heat resistive rubber to ensure an adhesion force with the semiconductor chip 1 in a parallel direction to prevent any lateral displacement of the semiconductor chip 1 from the chip plate 8', even if a lateral vibration or accretion is applied to the semiconductor chip 1.

Figure 7:
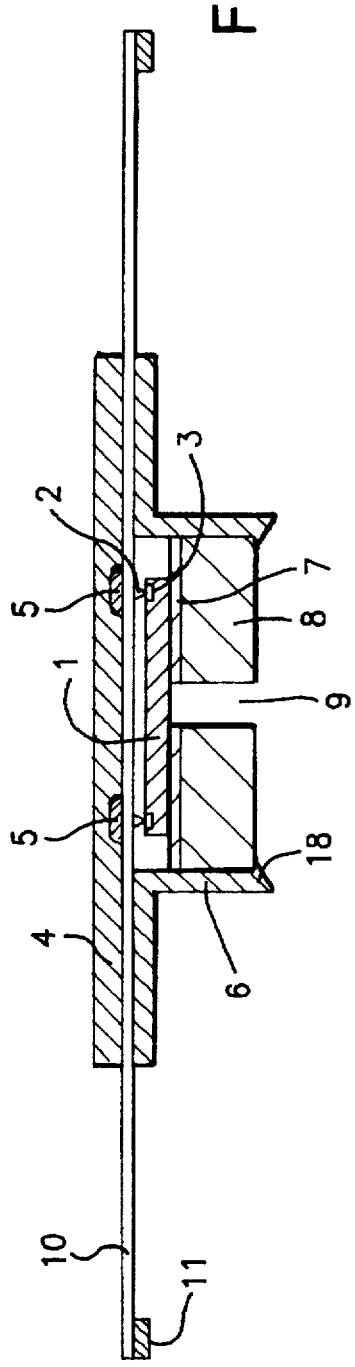
FIG. 7 is a cross sectional elevation view illustrative of a novel bare chip test carrier structure in a fourth embodiment according to the present invention.

A fourth embodiment according to the present invention will be described in detail with reference to FIG. 7. In this embodiment the carrier body 4 has plural recessed portions which receive silicone layers 5 which each extend over a different one of the carrier bump electrodes 2. The silicone layers 5 are made of an elastic material and allow the flexible substrate 10 to be partially pushed by the carrier bump electrodes 2 into the silicone layers 5 for compensating any difference in height between the convex electrodes to ensure the required positioning of the semiconductor chip in a lateral flat plane without any slope, in the manner described above.

Figure 8:
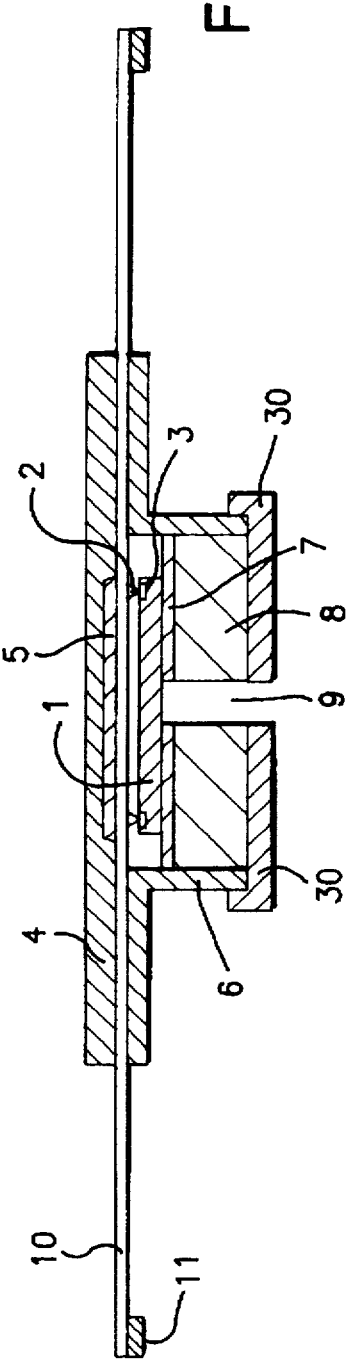
FIG. 8 is a cross sectional elevation view illustrative of a novel bare chip test carrier structure in a fifth embodiment according to the present invention.

A fifth embodiment according to the present invention will be described in detail with reference to FIG. 8. In this embodiment a cap 30 is provided to be engaged securely with the lower portion of the vertical portion of the holder 6. The cap 30 extends on the bottom surface of the chip plate 8 for supporting the chip plate 8.

A sixth embodiment according to the present invention will be described in detail with reference to FIG. 9. In this embodiment the chip plate holder 6 has flexible supporting plates 19 on its bottom. The supporting plates 19 extend inwardly on the bottom surface of the chip plate for supporting the chip plate. The supporting plates 19 of the chip plate holder 6 press up the chip plate 8 so that the chip plate 8 presses the semiconductor chip 1 to thereby allow an accurate positioning of the semiconductor chip 1 in a lateral direction by the above adhesion with the silicone layer 7 without any contact between the chip plate holder 6 and side portions of the semiconductor chip 1.

The seventh embodiment according to the present invention will be described in detail with reference to FIG. 10. In this embodiment the vertical portion of the chip plate holder 6 is fixed by screws 31 to an outside surface of the chip plate for supporting the chip plate 8. The screws 31 secures the chip plate holder 6 with the chip plate 8 to allow the chip plate 8 to press the semiconductor chip 1.

An eighth embodiment according to the present invention will be described in detail with reference to FIG. 11. In this embodiment the carrier body has a recessed portion which receives a heat resistive rubber layer 32 which extends over the semiconductor chip 1 so that the rubber layer 32 extends over at least the bump electrodes 2. The heat resistive rubber layer 32 has a resistance to a temperature of at least 125° C. The heat resistive rubber layer 32 is an elastic material and provided in order to allow the flexible substrate 10 to be partially pushed by the carrier bump electrodes 2 into the heat resistive rubber layer 32 for compensating for any difference in height between the convex electrodes to ensure the required positioning of the semiconductor chip in a lateral flat plane without any slope in the manner described above in relation to silicone layer 5.

Further, a heat resistive rubber layer 33 is provided on the chip plate 8. The heat resistive rubber layer 33 has a resistance to a temperature of at least 125° C. The heat resistive rubber layer 33 has the same lateral size as the chip plate 8. The chip plate 8 is provided to underlie the semiconductor chip 1 so that the heat resistive rubber layer 33 contacts the semiconductor chip 1. The heat resistive rubber layer 33 is provided to ensure an adhesion force with the semiconductor chip 1 in a parallel direction.

Whereas modifications of the present invention will be apparent to a person having ordinary skill in the art, to which the invention pertains, it is to be understood that embodiments as shown and described by way of illustration are by no means intended to be considered in a limiting sense. Accordingly, it is to be intended to cover by claims all modifications which fall within the spirit and scope of the present invention.

What is claimed is:

1. A semiconductor chip tester comprising:
   - a flexible substrate with a bump electrode thereon for contacting a contact pad on the chip when the chip is mounted in the tester;
   - a carrier body supporting and abutting said flexible substrate on a surface opposite said bump electrode, said carrier body having a recess that is open to said flexible substrate and aligned with said bump electrode;
   - a resilient material in said recess absorbing a flexure of said flexible substrate caused by pressure of said bump electrode when the chip is mounted in the tester;
   - a plate with an elastic surface that is larger than said recess, said elastic surface for adhesively holding the chip when the chip is mounted in the tester to prevent lateral movement of the chip; and
   - a plate holder with a peripheral surface supporting and abutting a peripheral surface of said flexible substrate opposite said carrier body to sandwich said peripheral surface of said flexible substrate between said peripheral surface of said plate holder and said carrier body, and an interior surface abutting said plate and urging said plate, and the chip when mounted on said plate, toward said flexible substrate and said bump electrode.

2. The tester of claim 1, wherein said recess is smaller than said interior surface of said plate holder.

3. The tester of claim 1, wherein a passageway is provided through said plate and said elastic surface to expose a surface of the chip, when mounted in the tester, for demounting the chip.

4. The tester of claim 1, wherein said plate holder comprises a side perpendicular to said peripheral surface of said plate holder and abutting a corresponding side of said plate, and wherein said interior surface comprises a flexible latch at a distal end of said perpendicular side for holding said plate.

5. The tester of claim 1, wherein said flexible substrate has a plurality of said bump electrode, and wherein said recess has lateral extent similar to a lateral extent of said bump electrodes.

* * * * *